(12) United States Patent
Stavrakos et al.

(10) Patent No.: US 8,312,074 B2
(45) Date of Patent: Nov. 13, 2012

(54) METHOD FOR MULTIPART ENCODING

(75) Inventors: Nicholas Stavrakos, Mountain View, CA (US); Fred Koopmans, Menlo Park, CA (US); Chris Koopmans, Sunnyvale, CA (US); Parikshit Ambatkar, Mountain View, CA (US)

(73) Assignee: Bytemobile, Inc., Santa Clara, CA (US)

( * ) Notice: Subject to any disclaimer, the term of this patent is extended or adjusted under 35 U.S.C. 154(b) by 571 days.

(21) Appl. No.: 11/439,330

(22) Filed: May 22, 2006

(65) Prior Publication Data

US 2006/0271642 A1 Nov. 30, 2006

Related U.S. Application Data

(60) Provisional application No. 60/685,260, filed on May 26, 2005.

(51) Int. Cl.
*G06F 15/16* (2006.01)
*G06F 15/173* (2006.01)
*G06F 15/167* (2006.01)

(52) U.S. Cl. ......... 709/203; 709/200; 709/213; 709/225

(58) Field of Classification Search .................. 709/203, 709/200, 213, 225; 707/3, 10
See application file for complete search history.

(56) References Cited

U.S. PATENT DOCUMENTS

| | | | |
|---|---|---|---|
| 7,096,418 B1 * | 8/2006 | Singhal et al. ................ 715/205 |
| 2002/0004813 A1 | 1/2002 | Agrawal et al. | |
| 2002/0055966 A1 * | 5/2002 | Border et al. ................ 709/200 |
| 2002/0194382 A1 * | 12/2002 | Kausik et al. ................ 709/246 |
| 2003/0188106 A1 * | 10/2003 | Cohen ........................... 711/133 |
| 2005/0086318 A1 * | 4/2005 | Aubault ....................... 709/213 |
| 2005/0144278 A1 * | 6/2005 | Atamaniouk ................ 709/225 |
| 2006/0271641 A1 * | 11/2006 | Stavrakos et al. ............. 709/217 |

FOREIGN PATENT DOCUMENTS

| | | |
|---|---|---|
| EP | 1 206 100 A1 | 5/2002 |
| WO | WO 99/22316 A1 | 5/1999 |
| WO | WO 01/40971 A2 | 6/2001 |

OTHER PUBLICATIONS

International Preliminary Report on Patentability for PCT/US2006/020200, mailed on Dec. 13, 2007.
Berners-Lee, T., et al., "RFC1945," http://rfc.net/rfc1945.html, The Internet Society (1996) pp. 1-57.
Fielding, R. et al., "RFC2616," http://rfc.net/rfc2616.html, The Internet Society (1999) pp. 1-165.
International Search Report and Written Opinion of the International Searching Authority for International Application No. PCT/US2006/020200, mailed Oct. 13, 2006, 13 pages.

* cited by examiner

*Primary Examiner* — Peter Shaw
(74) *Attorney, Agent, or Firm* — Finnegan, Henderson, Farabow, Garrett & Dunner LLP

(57) ABSTRACT

A system including a user agent configured to transmit request data to a content server, wherein the request data corresponds to a request for a web page; and an optimization server configured to receive a first response data corresponding to the request data from a content server, identify response object data within the first response data, query the content server for second response data that is associated with the identified response object data, and transmit optimized data to the user agent, wherein the contents of the optimized data can include the first response data and the second response data.

31 Claims, 9 Drawing Sheets

METHOD FOR MULTIPART ENCODING

CROSS REFERENCE TO RELATED PATENTS

This application claims the benefit of U.S. Provisional Application No. 60/685,260, filed May 26, 2005, "Advanced Data Optimization." This provisional application is incorporated herein by reference.

BACKGROUND INFORMATION

The Internet allows for vast amounts of information to be communicated over any number of interconnected networks, computers, and network devices. Typically, information or content is located at websites on one or more servers, and a user can retrieve the content using a user agent, such as a web browser, running on a client device. For example, the user can input a webpage address into the web browser or access a web link, which sends requests to the server to access and provide the content on the respective website. This type of communication is commonly referred to as "web browsing."

Web browsing is enjoyed by millions of users on the Internet. However, accessing content on a network that is constrained by bandwidth and latency can make web browsing less enjoyable. Bandwidth is the measurement of the speed of a network link. Lower bandwidth network links take more time to transfer content than higher bandwidth links. Latency is a measurement of the responsiveness of a network link. Higher latency networks take more time than lower latency networks to send a single byte of data over a network link.

Many networks can suffer from low bandwidth and/or high latency problems that degrade the enjoyment of web browsing for users. Wireless wide area networks (WANs), such as GPRS or CDMA 1xRTT wireless networks, are just a few networks, along with traditional plain old telephone (POTS) dialup networks, that can exhibit similar bandwidth and latency problems. These networks may take 50 to 100 seconds to download content from a web page due to bandwidth and latency constraints, whereas a high-speed local area network (LAN) may be less prone to such constraints and can download the same content in 5 to 10 seconds. Waiting a long time to view content for a web page is annoying to users and inefficiently utilizes the network.

Utilizing a network efficiently is also a particular concern for network providers who must share limited resources among many users. For example, wireless WAN providers share very expensive and limited spectrum among all of its data and voice subscribers. Thus, efficient use of the spectrum frequencies is imperative. Furthermore, in a wireless WAN environment, data transmission is more susceptible to interference and noise in contrast to a wired environment. Interference and noise delay the data transmission process and, more importantly, cause variability and unpredictability in the delay. A web site that may download objects in 50 seconds the first time may download the same objects in 100 seconds the next time. Thus, in order to address these concerns, network providers must efficiently use existing network infrastructure to provide the most efficiency to a user when downloading content.

Furthermore, the manner in which information is transferred on a network plays an important role in the network's efficiency. Referring to the World Wide Web (WWW), the Hypertext Transfer Protocol (HTTP) sets forth the rules for transferring content such as files or objects on the web. This protocol uses requests and responses for transferring content. For example, a user agent (e.g., a web browser or client) sends a request to the content server for a particular file or object of a web page and the server of the web page queries the object in a database and sends back the object as part of a response to the user agent. This process continues until every object in the web page has been downloaded to the user agent.

As web pages have become more complex, a common website may contain hundreds of objects on its web pages. Such objects may include text, graphics, images, sound, etc. The web pages may also have objects located across multiple servers. That is, one server may provide dynamic content (e.g., content that remembers the last books ordered by a user) for a web page, whereas other servers may provide static but rotating content such as an advertisement, and still others provide the static content of the site. As such, before a user can view a web page, hundreds of objects may require downloading from multiple servers. Each server, however, may take a different amount of time to service a request for an object contributing to latency. Thus, the latency for each server may vary with different levels of magnitude, e.g., one server may respond in milliseconds whereas another server may respond in seconds.

Latency constraints, however, should not be confused with bandwidth constraints. FIG. 1 illustrates the retrieval sequence for objects on a bandwidth constrained network using HTTP over TCP/IP. In this illustration, each request for an object requires a connection to be established between a client and a server with an exchange of "SYN" and "ACK" messages necessary for TCP/IP. Due to the relatively small latency of the network and the responsiveness of the server, the ACK message is sent back to the client quickly. However, because the network is bandwidth constrained, a response back to the client takes a relatively long time. This is exacerbated if the object for the request is large in nature and must be broken into many packets as shown in FIG. 1. As a result, the overall download time for each request/response is dominated by the time it takes to download all the packets of the individual objects on a network link. Such download time can be calculated by adding the size of each of the individual objects and dividing the aggregate size by the link bandwidth.

FIG. 2 illustrates the retrieval sequence for objects on a latency constrained network using HTTP over TCP/IP. In this illustration, the network is not limited by bandwidth, but instead by the latency or the time it takes to send a packet from the client to the server through the network. In particular, when a user agent requests small objects on a network affected by high latency, the overall download time is dominated by the time it takes a request to travel to the server, the responsiveness of the server to process the request, and the time it takes for a response to travel back to user agent. The download time of a web page with many objects can be calculated by adding the round trip time (RTT) for the request to travel to the server and the response to travel back to the client in addition to the response of the server and multiplying that by the number of objects on the web page.

Unfortunately, user agents are in fact a source of latency when downloading an object. This latency is a result of the user agent processing the downloaded objects and attempting to display these objects in the manner the web page designers intended. Web page designers use a multitude of different standards to instruct the user agents how a web page is suppose to look once rendered. The number of standards is increasing over time and include markup languages (e.g., Hyper Text Markup Language (HTML), Extensible HTML (XHTML), Wireless Markup Language (WML)), objects that define the overall style of the page (e.g., Cascading Style Sheets (CSS)), objects that are executed by the user agent (e.g., JavaScript), and image objects (e.g., JPEG, GIF, PNG). After downloading each object the user agent needs time to process and determine the impact of each object on the displayed web page. The processing time of each object may impact the download of subsequent objects. For CPU constrained devices (e.g., phones) the latency from browser processing time can contribute significantly to the overall download time of a web page. Also, for poorly implemented user agents certain objects may significantly impact the time to render a web page. Even over a high bandwidth and low latency network, the implementation of the user agent can result in these object processing times severely impacting the download time of the web page.

DESCRIPTION OF THE EMBODIMENTS

Reference will now be made in detail to the exemplary embodiments implemented according to the invention, the examples of which are illustrated in the accompanying drawings. Wherever possible, the same reference numbers will be used throughout the drawings to refer to the same or like parts.

Figure 1:
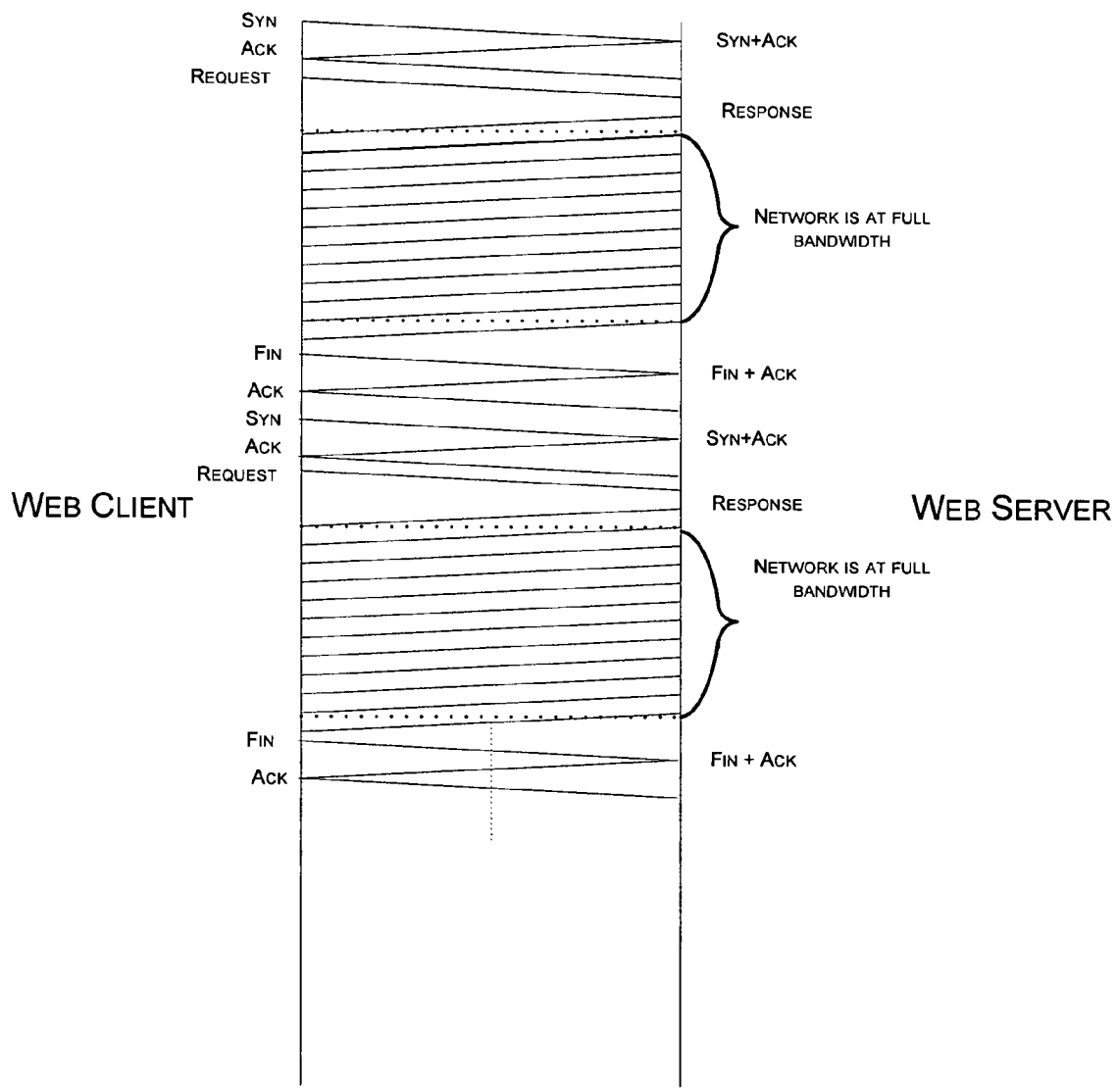
FIG. 1 illustrates the retrieval sequence for objects on a bandwidth constrained network using HTTP over TCP/IP.
Figure 2:
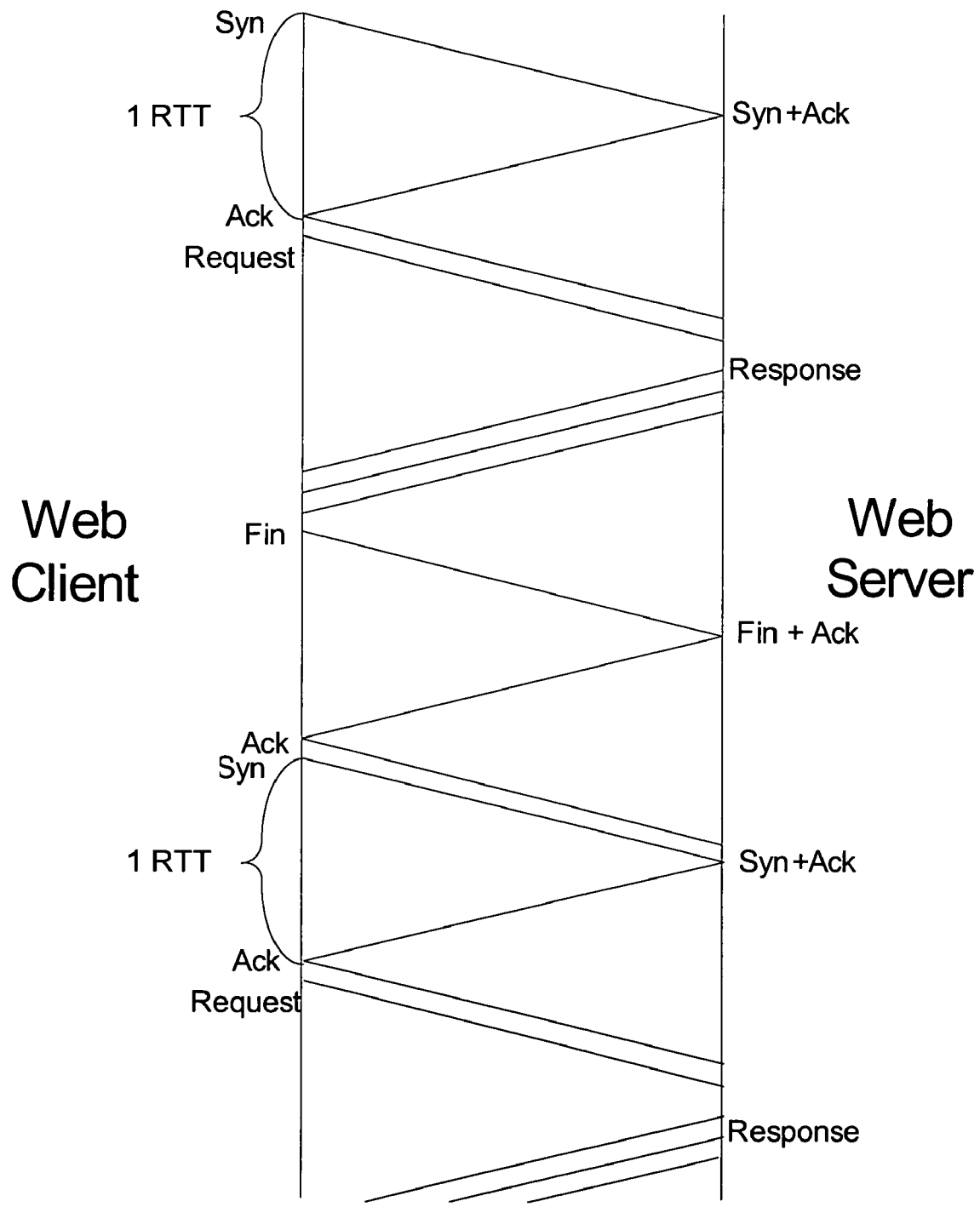
FIG. 2 illustrates the retrieval sequence for objects on a latency constrained network using HTTP over TCP/IP.
Figure 3:
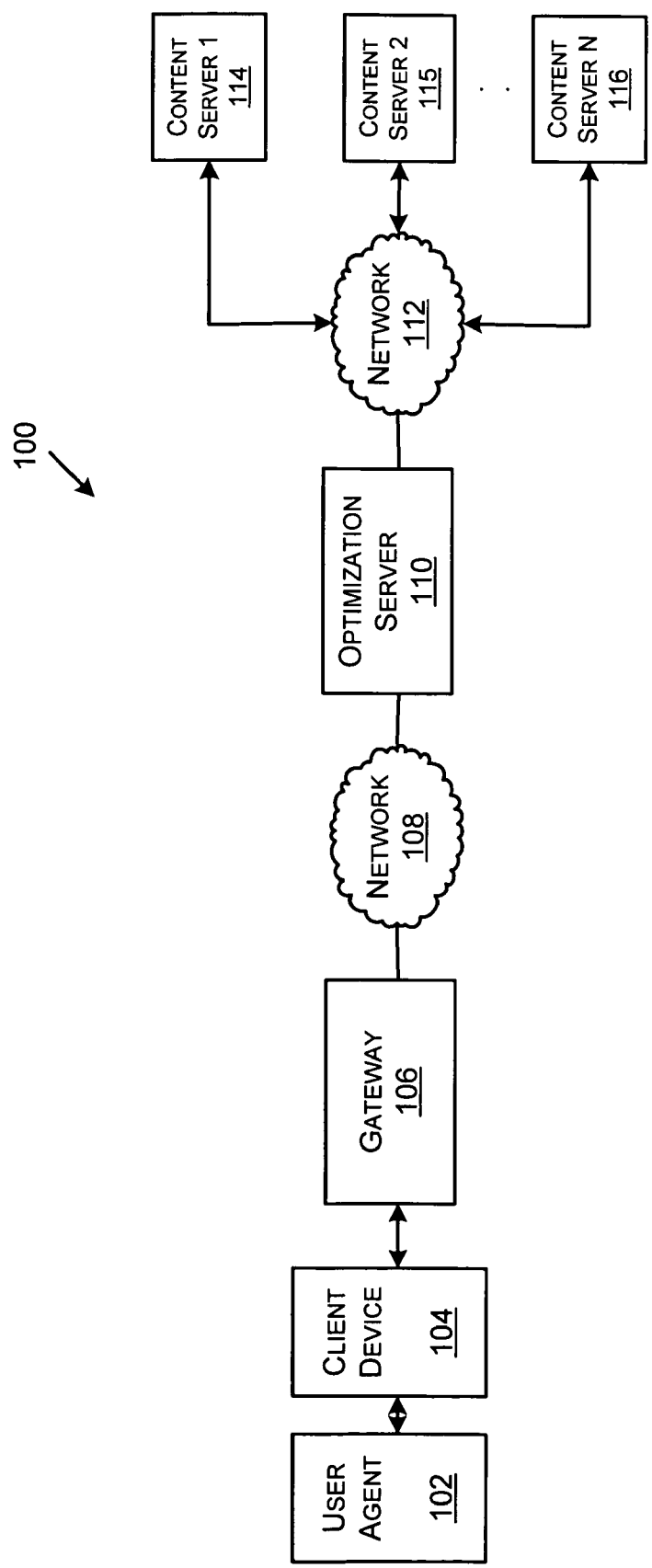
FIG. 3 is a block diagram of an exemplary system.

FIG. 3 is a block diagram of an exemplary system. Exemplary system 100 can be any type of system that transmits data over a network. For example, the exemplary system can include a browser accessing information from content servers through the Internet. The exemplary system can include, among other things, a user agent 102, a client device 104, a gateway 106, one or more networks 108, 112, an optimization server 110, and one or more content servers 114-116.

User agent 102 is a client application used with a network protocol. For example, user agent 102 could be a web browser, a search engine crawler, a screen reader, or a Braille browser, and user agent 102 could be used to access the Internet. User agent 102 can be a software program that transmits request data (e.g., an HTTP/HTTPS/WAP/WAIS/Gopher/RTSP request, etc.) to a web server and receives response data in response to the request data. For example, user agent 102 can send request data to the content servers 114-116 for a particular file or object data of a web page by its URL, and the content server of the web page can query the object data in a database and can send back the object data as part of the response data (e.g., HTTP/WAP response data) to the user agent. This process continues until every object in the web page has been downloaded to the user agent.

Client device 104 is a computer program or hardware device that can access remote services. Client device 104 can receive request data from user agent 102, can transmit the request data to the content servers, and can receive response data in response to the request data. For example, client device 104 can be Bytemobile Optimization Client Software. Client device's functionality is further described below. In some embodiments, user agent 102 and client device 104 can be housed in the same device, such as a computer, a PDA, a cell phone, a laptop, or any device accessing the Internet. In some embodiments, client device 104 can be removed and its functionality can be included in user agent 102.

Gateway 106 is a device that converts formatted data provided in one type of network to a particular format required for another type of network. Gateway 106, for example, may be a server, a router, a firewall server, a host, or a proxy server. The gateway 106 has the ability to transform the signals received from client device 104 into a signal that network 108 can understand and vice versa. Gateway 106 may be capable of processing audio, video, and T.120 transmissions alone or in any combination, and is capable of full duplex media translations.

Networks 108 and 112 can include any combination of wide area networks (WANs), local area networks (LANs), or wireless networks suitable for networking communication such as Internet communication.

Optimization server (OS) 110 is a server that provides communication between gateway 106 and content servers 114-116. For example, OS 110 could be a Bytemobile Optimization Services Node. OS 110 can optimize performance by enabling significantly faster and more reliable service to customers. OS's 110 can include optimization techniques, which are further described below.

Content servers 114-116 are servers that receive the request data from user agent 102, processes the request data accordingly, and return the response data back to user agent 102. For example, content servers 114-116 can be a web server, an enterprise server, or any other type of server. Content servers 114-116 can be a computer or a computer program that is responsible for accepting HTTP requests from the user agent and serving the user agents with web pages.

Figure 4:
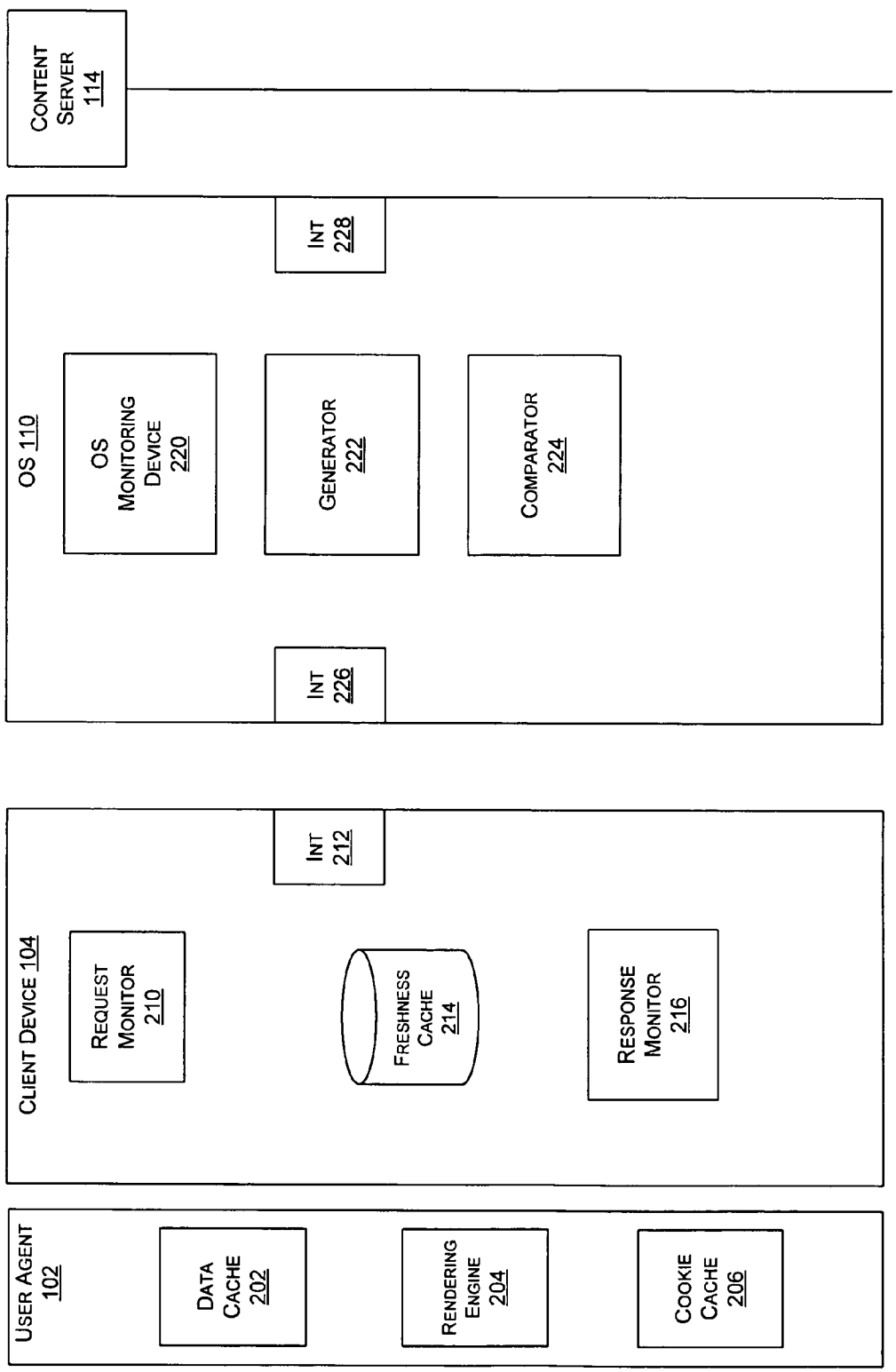
FIG. 4 is a block diagram illustrating an embodiment of the exemplary system of FIG. 1.

FIG. 4 is a block diagram illustrating an embodiment of the exemplary system of FIG. 3. User agent 102 may include, among other things, a data cache 202, a rendering engine 204, and a cookie cache 206.

Data cache 202 is a storage device that stores web documents to reduce bandwidth usage for web page access times. Data cache 202 stores copies of object data requested and received by the user. Subsequent web page requests may be satisfied by accessing data cache 202 if certain conditions are met. Such conditions may include whether the object data is located in data cache 202 and whether the object data is deemed fresh or stale. For example, the freshness of the object data can be defined by the definition of 'fresh' and 'stale' in RFC 1945 and RFC 2616.

Rendering engine 204 can be a software application that enables a user agent to display and interact with text, images, and other information located on a webpage. When a user types in a web address or URL into the user agent 102, the rendering engine 204 uses Hypertext Transfer Protocol (HTTP) to initiate the request with the content server, e.g., content server 114. Although rendering engines can be used to access the Internet, they can also be used to access data provided by web servers in private networks or content in file systems.

Cookie cache 206 is a device that stores data relating to cookies. In some embodiments, cookie cache 206 is located on the hard drive of user agent 102. Cookie cache can include cookies, which can include, among other things, user IDs, passwords, preference data, etc.

Client device 104 may include, among other things, a request monitor 210, an interface 212, freshness cache 214, and response monitor 216.

Request monitor 210 can be a software program or a hardware device that receives or intercepts the request data, such as an HTTP request for a specific URL, from rendering engine 204. Request monitor 210 can identify the request object data (e.g., embedded URLs) embedded within the request data and create a request object list that includes the request object data, the freshness data of the request object data, and/or any cookie data associated with the request object data. Request monitor 210 has the ability to communicate with user agent 102 to determine whether the request object data and any cookie data associated with the request object data are stored in user agent 102 and if so, whether the request object data is fresh or stale. Request monitor 210 has the ability to forward to OS 110 the request data and, if available, the request object list. While request monitor 210 is provided in client device 104, it will be readily appreciable that the request monitor could be located in user agent 102.

Interface 212 is a software program or a hardware device that communicatively couples client device 104 to the communication means (e.g., wireless and/or wired) connecting client device 104 and OS 110. Interface 212 is configured to receive the request data from the request monitor, translate the request data, and transmit the translated request data to OS 110. Further, interface 212 is configured to receive information from the communication means connecting client device 104 and OS 110. In some embodiments, the interface 212 can include encryption means and/or decryption means to encrypt communication leaving from and decrypt communication coming into client device 104.

Freshness cache 214 is a device that stores the freshness data of object data that the user agent has determined to be stale. For example, freshness cache 214 can be a list, an array, a database, a cache, etc. When the client device 104 receives request data from the user agent and the request data includes request object data that is stale, the freshness cache 214 can be accessed to determine whether that stale object data is actually fresh. If the stale object data is indeed fresh, client device 104 can inform the user agent that the object data stored in data cache 202 is fresh. Freshness cache 214 receives freshness data from response monitor 216 when optimized data includes the freshness data.

Response monitor 216 can be a software program or a hardware device that receives optimized data from the OS 110. The optimized data can include, among other things, response data received from the content server, embedded response data corresponding to the object data on the request object list, freshness data for a request object data that was marked as stale and verified by the content server to be fresh ("fresh" stale object data), and/or response data corresponding to stale request object data. After receiving the optimized data, the response monitor 216 separates the optimized data and processes the separated data accordingly. Response monitor 216 is communicatively coupled to OS 110, freshness cache 214, and user agent 102.

Optimization server (OS) 110 may include, among other things, an OS monitoring device 220, a generator 222, a comparator 224, and a plurality of interfaces 226 and 228.

OS monitoring device 220 is a software program or a hardware device that monitors the request data received through the interface 226 from either user agent 102 or client device 104. In some embodiments, the request data may include additional appended data, such as the request object list identifying request object data, the freshness data of the request object data, and any cookie data associated with the request object data. When the OS monitoring device 220 receives the request data, the OS monitoring device 220 can extract any appended data from the request data and transmit the original request data from the user agent through interface 228 to the content server 114. OS monitoring device 220 can provide the extracted appended data to other components within the OS, such as comparator 224.

Generator 222 is a software program or a hardware device that receives the response data from content server 114. Generator 222 can analyze the response data (e.g., HTTP response of a requested URL) and determine if the response data contains references to response object data (e.g., one or more URLs and/or embedded URLs) that user agent 102 would have to download. For example, a GIF image would not contain references to other content data for a browser to download, while the markup language (e.g., WML, HTML, XHTML, etc) of a webpage can have references to other response object data that browser 204 would have to download. Generator 222 could then have the ability to generate a response object list that identifies the response object data. For example, the generator could receive a URL from the content server 114 and identify the embedded URLs located within the URL and the response object list could identify the response object data as being, among other things, the URL, the embedded URL, and any relevant data of the URL and the embedded URL (cookie data, FQDN, etc.).

Comparator 224 is a software program or a hardware device that receives the request object list from OS monitoring device 220 and response object list from generator 222 and compares them. An exemplary comparing method is further described below in FIG. 8B. Based on the comparison, comparator 224 can update the response object list. After the comparison, comparator 224 can transmit optimized data, which can include, among other things, response data received from the content server, response data corresponding to the object data on the URL list, freshness data for a request object data that was marked as stale and verified by the content server to be fresh ("fresh" stale object data), and/or response data corresponding to stale request object data.

Interfaces 226 and 228 are similar to interface 212 of client device 104. Each interface has the ability to communicate with the elements of the optimization server, translate the communication so that the communication means can utilize the data, and transmit the translated communication across the corresponding communication means. Like interface 212, interfaces 226 and 228 may have encryption and decryption means.

Figure 5:
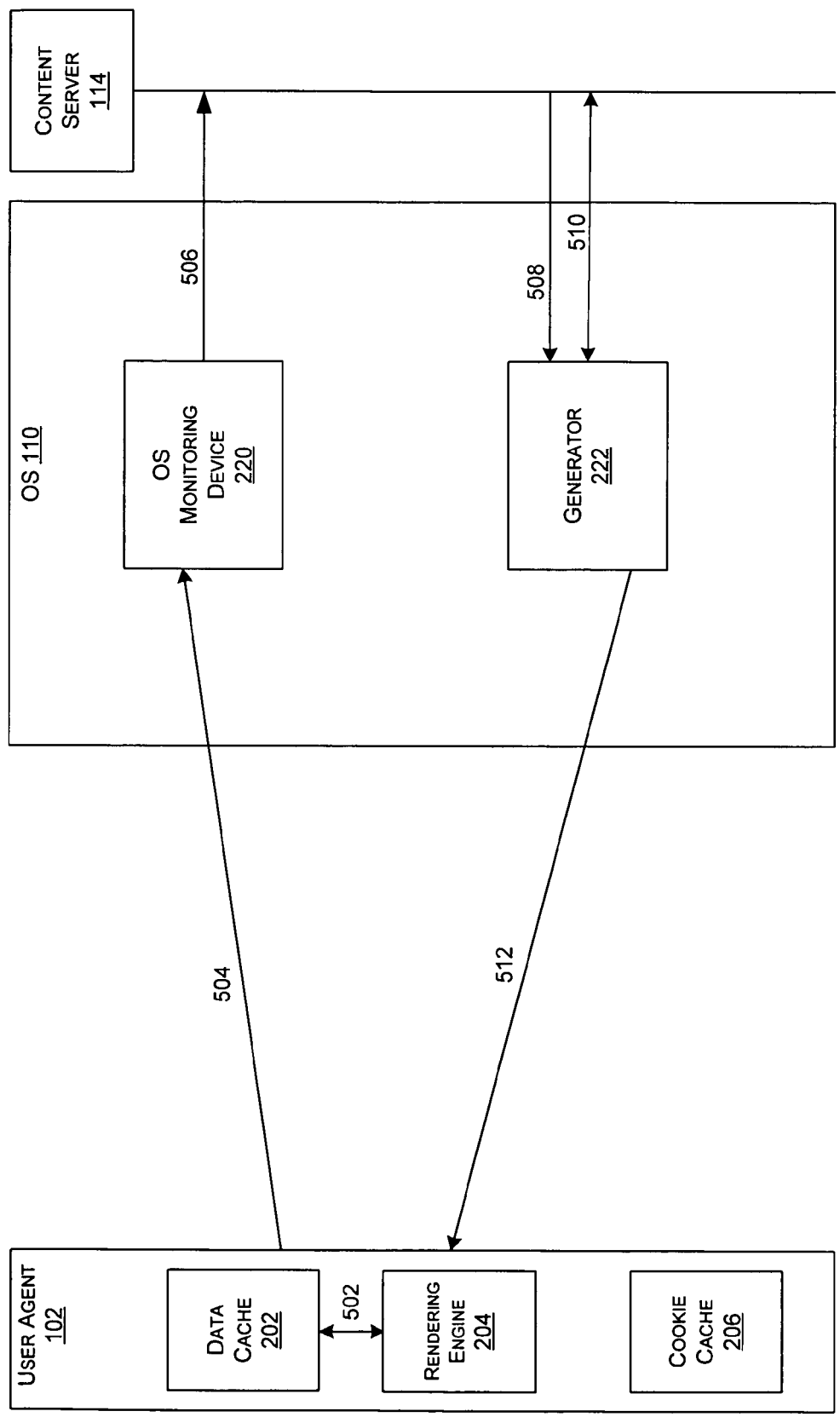
FIG. 5 is a functional diagram illustrating an exemplary communication flow in the exemplary system of FIG. 4.

FIG. 5 is a functional diagram illustrating an exemplary communication flow in the system of FIG. 4. It is assumed for the purposes of explaining this exemplary communication flow that when a web page is first requested by the rendering engine 204, the content data of the web page (e.g., data relating to the URI/URL) does not reside in a data cache 202 of user agent 102 although other components of the web page may reside in data cache 202. In addition, while a single content server 114 has been displayed for simplicity purposes, any number of content servers could be provided. The user inputs a URL into rendering engine 204 of user agent 102. Rendering engine 204 queries (502) data cache 202 for any content data relating to the URL and, for purposes of this exemplary communication, data cache 202 does not return any content data to rendering engine 204.

After the query, the user agent 102 transmits (504) the request data to OS 110. In some embodiments, not shown in FIG. 5, user agent 102 transmits the request data to client device 104, wherein client device 104 analyzes it before forwarding the request data to OS 110. The request data can be directed explicitly to a gateway or proxy and then to OS 110, or it can be directed to the content server 114 and the request can be intercepted transparently by an inline proxy or gateway. In some embodiments, the request data is directed to content server 114. Further, in some embodiments, user agent 102 can send the request data over a wireless link. The OS monitoring device analyzes the request data and determines whether the request is transmitted from either a user agent (e.g., user agent 102) or a client device (e.g., client device 104) that contains the client hardware/software having the necessary capabilities. The hardware/software capabilities for supporting multipart data can be determined by the request data explicitly stating multipart support, a user agent string of the request data, source IP address of a device (e.g., user agent 102) making the request, or OS 110 assumes that multipart is available for every received request data. As in this case, OS 110 determines that the user agent 102 has the capabilities and forwards (506) the request data to the appropriate content server 114. Consequently, the content server 114 provides (508) response data (e.g., HTTP response data) associated with the request data to generator 222 of OS 110.

After generator 222 has received the response data, generator 222 analyzes the response data to determine if it includes references to response object data (e.g., embedded URLs) embedded within that the rendering engine 204 would have to download. For example, a GIF image might be compressible by the proxy, but it does not contain references to other object data that a web browser would have to download, while a markup language or a URL data can have references to other response object data that the web browser would have to download. Further, the OS can determine if the response data comes from a server that has capabilities supporting this type of multipart optimization. These capabilities for supporting multipart data can be determined by the response data explicitly stating multipart support (e.g., HTTP response header), the IP address of the content server, or OS 110 assumes that multipart is available for every received response data.

As in this case, where the OS has determined that the response and request data support multipart, generator 222 can parse through the response data and create a response object list that identifies response object data (e.g., URLs and embedded URLs) within the response data. In some embodiments, the identification of the response object data can be dependent upon the capabilities of user agent 102 and/or client device 104. For each response object data, OS 110 downloads (510) from content server 114 the response data corresponding to the response object data (embedded response data).

After generator 222 has received any embedded response data from content server 114, generator 222 forwards (512) optimized data to the user agent or client device 104. In this exemplary embodiment, the optimized data can include, among other things, the response data and the embedded response data. The optimized data is formed by appending the embedded response data to the response data by using an appending method used in multipart encoding as defined in RFC 1521, 2068, 1867, 2112, 1892, 1847, or any other encoding defined by the Internet or WAP standards. In addition to the appending method, the response data may be changed slightly, in accordance with multipart encoding, so the user agent can find the embedded response data. For example, the response object data is grouped together in the order as they appear in the response to the original HTTP request, in the order as the response data comes back from the content server, or based on the type (e.g., GIF images before JPEG images).

Once user agent 102 receives the optimized data, the user agent processes the optimized data accordingly. In some embodiments, if the optimized data is forwarded to client device 104, client device 104 can either forward the optimized data to user agent 102 or separate the optimized data accordingly and forward the separated data to the components of user agent 102. Once user agent 102 receives the optimized data, rendering engine 204 can display the response data and the embedded response data associated with the request data without having to retransmit another request to obtain additional data from content server 114. Further, user agent 102 can store the response data and the embedded response data in data cache 202 for a configurable amount of time for subsequent requests.

Figure 6:
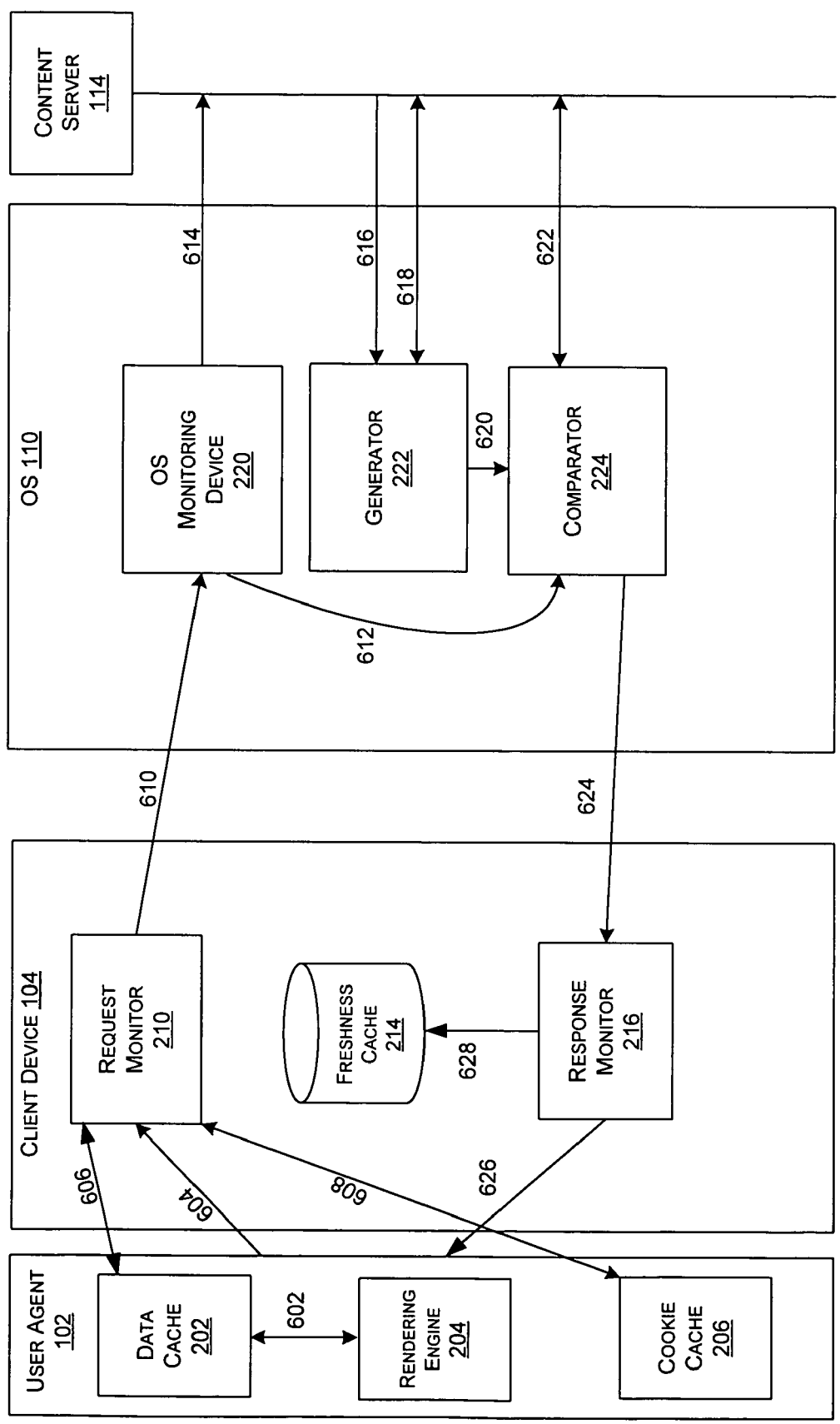
FIG. 6 is a functional diagram illustrating an exemplary communication flow in the exemplary system of FIG. 4.

FIG. 6 is a functional diagram illustrating an exemplary communication flow in the system of FIG. 4. It is assumed for the purposes of explaining this exemplary communication flow that when a web page is first requested by rendering engine 204, some of the content data of the web page resides in data cache 202 of user agent 102 and the stored content data is stale. In addition, while a single content server 114 has been displayed for simplicity purposes, any number of content servers could be provided. A user inputs a URL into a rendering engine 204 of a user agent 102. Rendering engine 204 queries (602) data cache 202 for any content data relating to the URL and data cache 202 determines that at least some of the content data is stale. User agent 102 transmits (604) the request data to request monitor 210 of client device 104. In some embodiments, request monitor 210 can be located within user agent 102.

After client device 104 has received the request data, request monitor 210 queries (606) data cache 202 of user agent 102. In some embodiments, request monitor 210 does not query the data cache 202 because user agent 102 has provided the embedded request object data along with the request data. Based on the query, the request monitor generates a request object list that identifies the request data and any request object data embedded within the request data (e.g., the HTTP request identifying a URL that has additional embedded URLs). The request object list may also provide information regarding the freshness data associated with the request object data and the embedded object data. For example, when data cache 202 returns that the object data is stale in response to querying step 606, the request object list is updated by marking the corresponding object data (request object data or embedded request object data) as being stale. If data cache 202 returns data indicating that the object data is fresh, the request object list is updated by marking the corresponding object data as being fresh. If by chance the object data is not found in the data cache, the request object list can be updated by deleting the object data from the list. After request monitor 210 has generated the list, request monitor 210 can query (608) cookie cache 206 for any existing cookie data related to the object data on the request object list. Consequently, the request object list can be updated to include the cookie data. The identification of the request object data can be dependent on client device 104 and user agent 102. For example, while some user agents display all request object data of a web page, other user agents try to intelligently render the web page onto a small screen. This intelligent rendering may only download a subset of embedded request object data within the webpage. Consequently, the parsing performed may consider these intelligent rendering techniques for each client device and each user agent.

After request monitor 210 has queried cookie cache 206, request monitor 210 can forward (610) the request data along with the request object list. In some embodiments, the request data and the request object list can be sent separately while in other embodiments, the request object list can be appended to the request data. The rest of this exemplary embodiment will assume that the request object list was appended onto the request data.

OS monitoring device 220 of OS 110 receives the request data from the client device, analyzes the request data, and determines whether the request data has been transmitted from either a user agent (e.g., user agent 102) or a client device (e.g., client device 104) that contains the client hardware/software having the necessary capabilities. The hardware/software capabilities for supporting multipart data can be determined by the request data explicitly stating multipart support, a user agent string of the request data, source IP address of a device (e.g., user agent 102) making the request, or OS 110 assumes that multipart is available for every received request data. Further, if the request object list has been appended to the request data, OS monitoring device 220 can extract the request object list from the response data and forward (612) the request object list to comparator 224. OS monitoring device 220 can forward (614) the request data (without the appended request object list) to the appropriate content server 114. Then, the content server 114 provides (616) response data associated with the request data to generator 222 of OS 110.

After generator 222 has received the response data, generator 222 analyzes the response data to determine if the response data includes references to embedded response object data that the rendering engine 204 would have to download. For example, a GIF image might be compressible by the proxy, but it does not contain references to other object data that a web browser would have to download, while a markup language or URL can have references to other object data that the web browser would have to download. Further, the OS can determine if the response comes from a server that has capabilities that can support this type of multipart optimization. These capabilities for supporting multipart data can be determined by the response data explicitly stating multipart support (e.g., HTTP response header), IP address of the content server, or OS 110 assumes that multipart is available for every received response data.

Generator 222 can parse through the response data and can create a response object list identifying the request object data (e.g., URLs and embedded URLs within the requested URL) within the request data. In some embodiments, the identification of the embedded object data can be dependent upon the capabilities of user agent 102 and/or client device 104. For each embedded response object data, OS 110 downloads (618) from content server 114 the response data corresponding to the embedded response object data (embedded response data).

After generator 222 has received any embedded response data from content server 114, generator 222 can forward (620) the response data and the response object list to comparator 224. Comparator 224 compares each request object data, which can include the URL request and the embedded URL request, on the request object list with each response object data, which can include the URL response and the embedded URL response, on the response object list. If the response object data matches the request object data and the matched request object data is fresh, comparator 224 can delete the response object data from the response object list because the response object data is not to be downloaded since it is already stored at data cache 202 of user agent 102. Alternatively, in some embodiments, the response object data from the response object list can be marked as not being downloaded to user agent 102 instead of being deleted from the response object list. If the response object data does not have a corresponding match in the request object list, comparator 224 can update the response object list to include information that this particular response object data is to be downloaded to user agent 102.

If the response object data matches the request object data and the matched request object data is stale, comparator 224 can determine if the request object data is truly stale by requesting the content server to verify the freshness of the request object data. Comparator 224 queries (622) content server by transmitting the stale information and content server provides a response to the query that either matches the stale request object data or not. If the content server verifies that the request object data is stale, comparator 224 can update the response object list by marking that the particular response object data is to be downloaded to user agent 102. If the content server verifies that the alleged stale request object data is indeed fresh ("fresh" stale object data), comparator 224 can update the response object list to include information that this particular response data object is not to be downloaded to user agent 102. Comparator 224 updates the response object list for each request object data within the list. In some embodiments, the comparator does not verify the freshness of the object data and accepts the freshness data that was provided on the request object list.

After the comparator has updated the response object list, comparator 224 can gather the response data and the embedded response data to form optimized data. Based on the capabilities of user agent 102 or client 104, comparator 224 has the ability to distinguish which segments of response data are to be sent as optimized data to user agent 102 or client device 104. In some embodiments, where these capabilities are present, comparator 224 has the ability to only provide the embedded response data corresponding to the new or stale object data because comparator 224 has determined that the fresh response data is already stored in data cache 202. Thus, only the minimum number of bytes are transmitted to the user agent. In some embodiments, the optimized data can include the embedded response data that was marked on the response object list as not being downloaded to the user agent (e.g., where the user agent or the client device does not have the capabilities to inform the user agent that a particular response data is fresh). In some embodiments, where the user agent or client device has the capabilities, comparator 224 can include freshness data within the optimized data informing the user agent or client device that the request object data that was marked as being stale in the request object list was indeed fresh.

The optimized data is formed by appending the embedded response data and freshness data to the response data by using an appending method used in multipart encoding as defined in RFC 1521, 2068, 1867, 2112, 1892, 1847, or any other encoding defined by Internet or WAP standards. In addition to the appending method, the response data may be changed slightly, in accordance with multipart encoding, so user agent 102 can find the embedded response data. For example, the response object data can be grouped together in the order as they appear in the response to the original HTTP request, in the order as the response data comes back from the content server, or based on the type (e.g., GIF images before JPEG images).

Once the optimized data is ready, comparator 224 can forward (624) the optimized data to response monitor 216. Once response monitor 216 receives the optimized data, response monitor 216 processes the optimized data accordingly. The response monitor 216 can extract the response data and the embedded response data that corresponds to stale object data and forward (626) this extracted data to user agent 102 where the user agent 102 can process the extracted data.

For example, if user agent 102 receives response data and embedded response data that corresponds to stale object data, user agent 102 can combine the fresh content data with the response data and embedded response data to form a complete web page. Further, response monitor 216 can extract any freshness data from the optimized data and then forward (628) this freshness data to freshness cache for storing. When the request monitor receives subsequent requests from user agent 102 and these subsequent requests include stale object data that is stored in freshness cache 214, the request monitor can access the freshness cache to inform user agent 102 that the object data was indeed fresh so the user agent would not have to download response data corresponding to this "fresh" stale object data. Alternatively, in some embodiments, if the optimized data is forwarded to user agent 102, user agent device 102 can separate the optimized data accordingly and process the separated data accordingly.

Once the user agent 102 has been provided with response data and the embedded response data, the rendering engine 204 can display the response data and the embedded response data associated with the request data without having to retransmit another request to obtain additional data from the content server. Further, the user agent can store the response data and the embedded response data in data cache 202 for a configurable amount of time.

Figure 7:
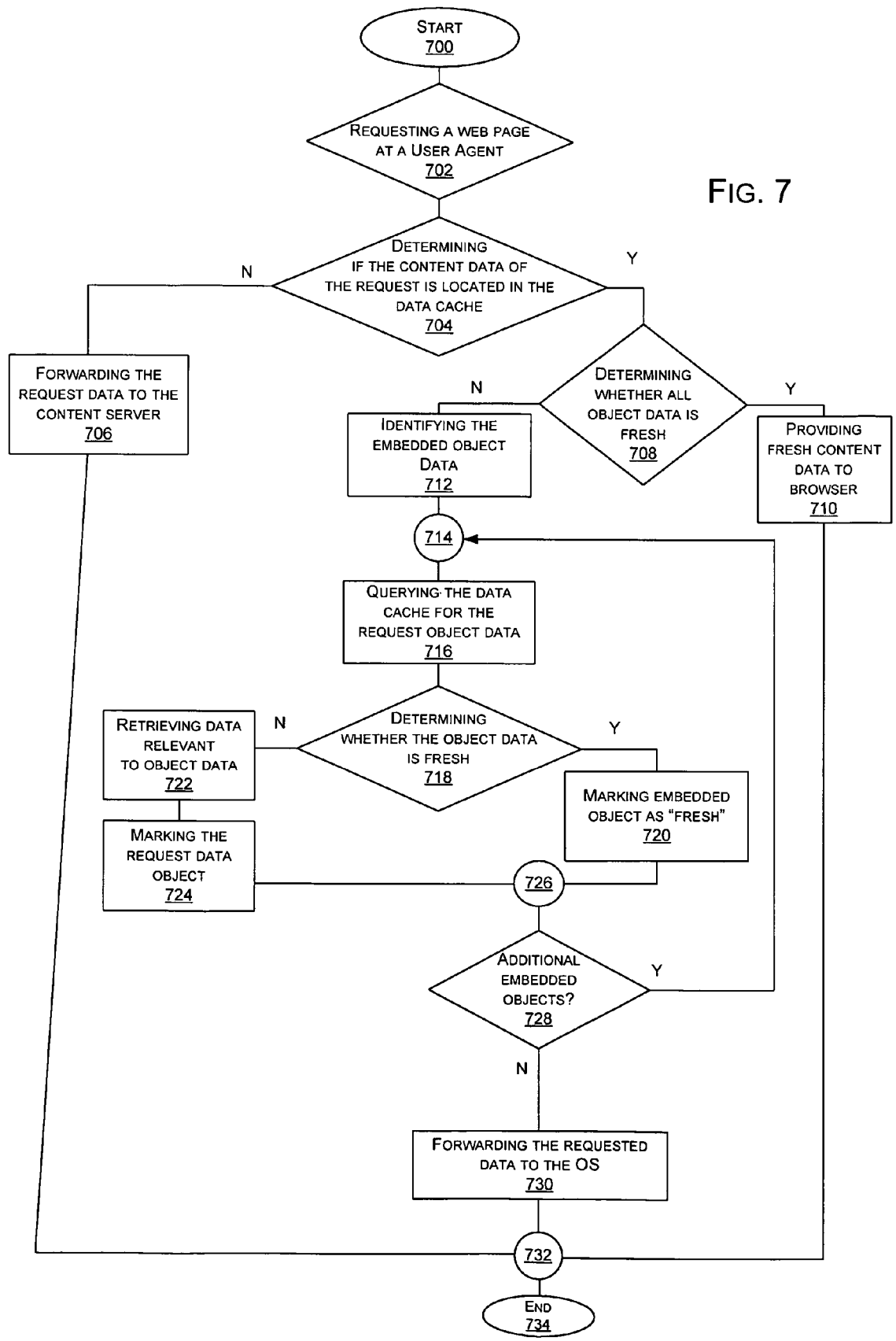
FIG. 7 is a flowchart representing an exemplary method for processing request data.

FIG. 7 is a flowchart representing an exemplary method for processing request data. Referring to FIG. 7, it will be readily appreciated by one of ordinary skill in the art that the illustrated procedure can be altered to delete steps or further include additional steps. While the exemplary method provided in FIG. 7 is tailored more towards a client device, it is readily appreciable that the exemplary method can be performed in part or exclusively by a user agent. After initial start step 700, a user requests (702) a web page from a user agent.

After the web page has been requested, the user agent determines (704) whether the content data of the request is stored in a data cache located at the user agent. For example, the content data can be markup language content data of a requested web page wherein the markup language can be HyperText Markup Language (HTML), Extensible HTML (XHTML), Wireless Markup Language (WML), compact HTML (cHTML), compact compact HTML (ccHTML), etc. If the content data is not stored, the user agent can forward (706) the request data (e.g., HTTP request for the URL) to the content server and then proceed to connector 732. In some embodiments, the client device intercepts the request data and then forwards the request data to the content server. In some embodiments, the user agent forwards the request data to an OS. On the other hand, if the content data is stored, the user agent determines (708) whether all content data is fresh or stale. If all content data is fresh, the user agent provides (710) the fresh content data to the web browser and the method proceeds to connector 732. If some of the content data is stale, the client device can identify (712) request object data embedded within the request data and place all identified object data on a request object list. For example, the object data can include the requested URL and/or embedded URLs associated with the requested URL.

After the identification, the client device can query (716) the data cache by providing the request object data and receiving any freshness data of the object data stored at the data cache of the user agent. The user agent can determine (718) whether the stored object data is fresh. If the stored object data is fresh, the corresponding request object data on the request object list is marked (720) as being fresh and the method proceeds to connector 726. On the other hand, if the stored object data is stale or not present at the data cache, the client device retrieves (722) any relevant data related to this object data. For example, the relevant data may include any cookie data or any freshness data associated with the object data only if the content data is in the data cache and is stale. After the retrieval of any relevant data, the corresponding request object data on the request object list is marked (724) accordingly. The request object data is marked stale if the corresponding stored object data is found to be stale or is marked to be downloaded if the stored object does not exist. In some embodiments, the request object data is removed from the request object list if the stored object does not exist in the data cache. Further, the degree of staleness of the object data (e.g., last-modified date or age of the URL) can be saved for the request object data so when a verification request is sent to a content server as described in step 922 in FIG. 8B below, the content server can verify whether the object data is indeed fresh or truly stale. After the marking, the method can proceed to connector 726.

The client device can then determine (728) whether there is any additional embedded request object data. If so, the method proceeds to connector 714. Otherwise, client device can then forward (730) the request data, which can include the request object list, to the OS. The method can proceed to connector 732 and then end (734).

Figure 8A:
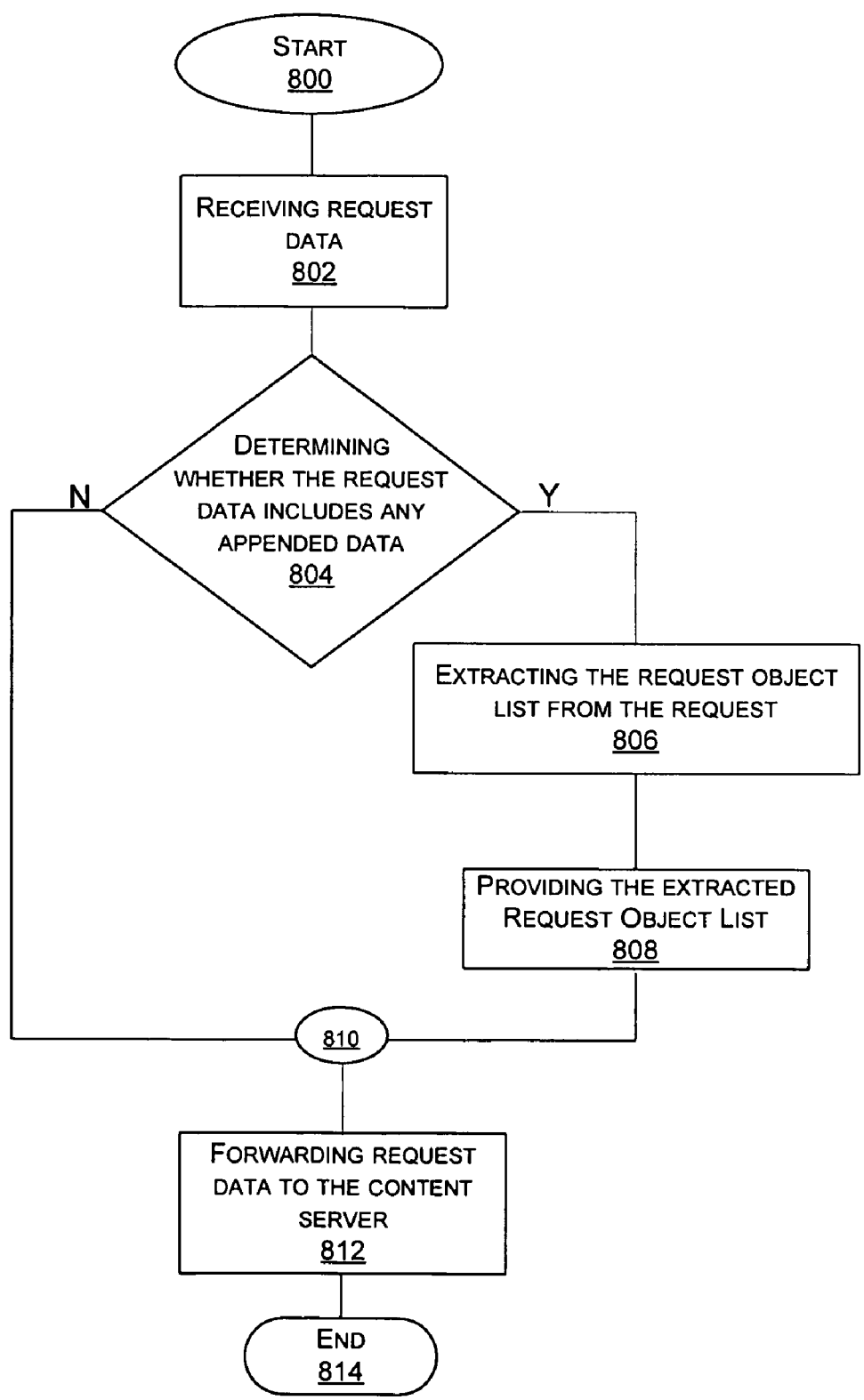
FIGS. 8A & 8B are flowcharts representing exemplary methods for processing request and response data.
Figure 8B:
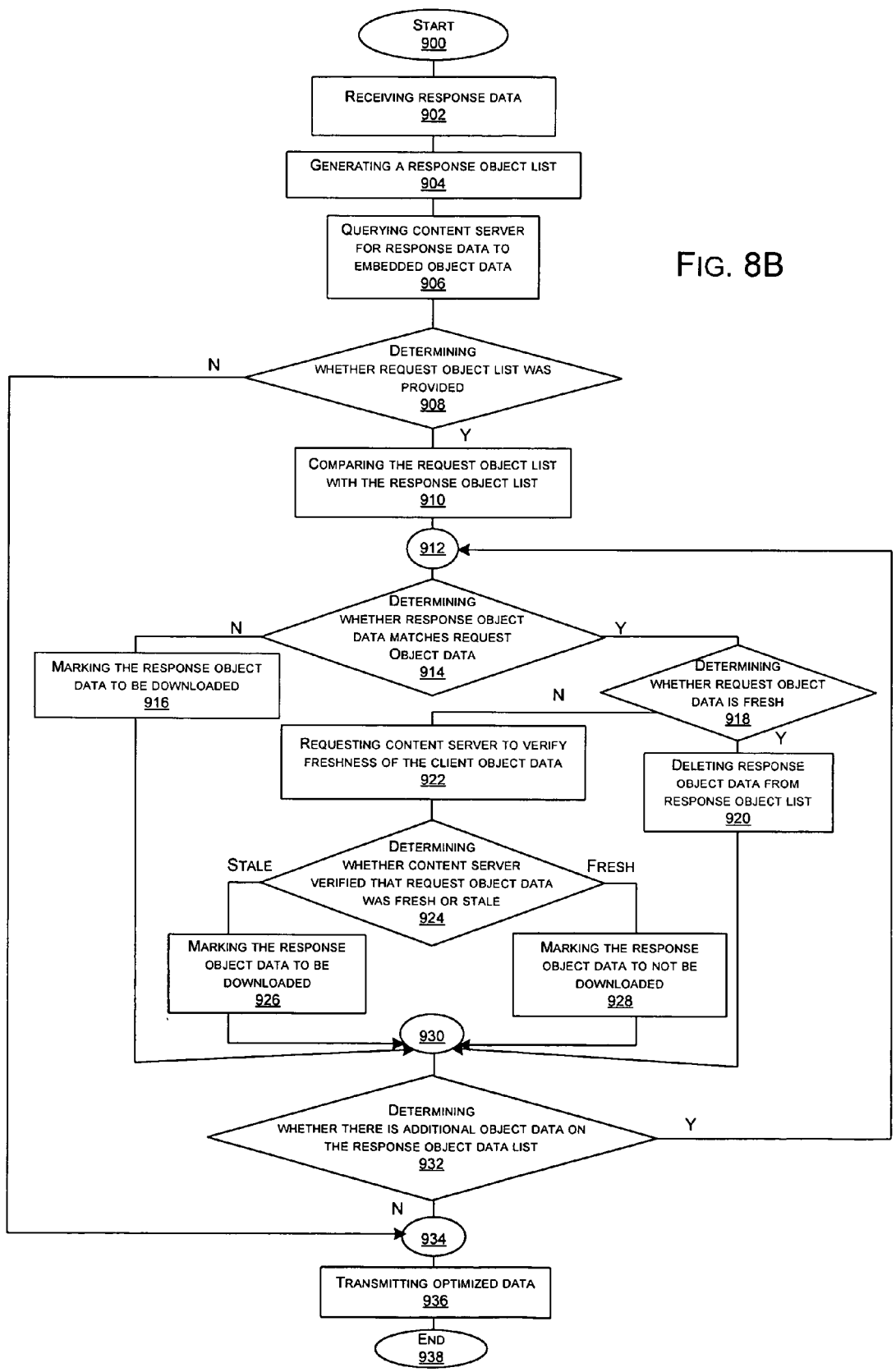

FIGS. 8A & 8B are flowcharts representing exemplary methods for processing request data and response data at an OS. Referring to FIG. 8A, it will be readily appreciated by one of ordinary skill in the art that the illustrated procedure can be altered to delete steps or further include additional steps. After initial start step 800, the OS receives (802) request data from the client device. In some embodiments, the request data may come from the user agent.

After the OS receives the request data, the OS can determine (804) whether the request data includes a request object list. For example, the request object list may include request object data, such as URLs and embedded URLs, and data relating to the request object data such as freshness data and whether the request object data is fresh or stale. If the request data does not include the request object list, the method can proceed to connector 810. Otherwise, if the request data does include the request object list, the OS can extract (806) the request object list from the request data and provide (808) the request object list to other hardware devices or software programs within the OS. For example, the provided request object list can correspond to the request object list determined to be provided in step 908 in FIG. 8B. The method can then proceed to connector 810.

The OS can then forward (812) the request data, without the request object list, to one or more contents servers. After the forwarding step 812, the method can end (814).

Referring to FIG. 8B, it will be readily appreciated by one of ordinary skill in the art that the illustrated procedure can be altered to delete steps or further include additional steps. After initial start step 900, an OS can receive (902) response data from a content server. For example, the response data can be the response data associated to the request data sent to the content server in step 812 of FIG. 8A.

After receiving the response data from the content server, the OS can generate (904) a response object list based on the response data. The OS generates the response object list by analyzing the response data and parsing through the response data to identify response object data embedded within the response data. For example, the response object data can include one or more URLS and the response data can be markup language content data of a requested web page wherein the markup language can be HyperText Markup Language (HTML), Extensible HTML (XHTML), Wireless Markup Language (WML), etc. For example, the response object list may include response object data, such as requested URLs and/or embedded URLs, and data relating to the response object data such as freshness data, and whether the response object data is to be downloaded to the user agent.

After the OS has generated a response object list identifying the response object data of the response data, the OS queries (906) the content server by supplying the response object data and receiving embedded response data from the content server. For example, after the OS has identified embedded URLs, the OS supplies these URLs to the content server and the content server can supply an HTTP response that relates to the embedded URLs.

OS can determine (908) whether the extracted request object list was provided. For example, the request object list may include request object data, such as URLs and embedded URLs, and data relating to the request object data such as freshness data, cookie data, and whether the object data is to be downloaded to a user agent. If the extracted request object list was not provided, the method can proceed to connector 934. Otherwise, if the extracted request object list was provided, the OS can compare (910) the request object data within the request object list with the response object data within the response object list.

During the comparison, the OS determines (914) whether a particular response object data matches any request object data. If there is not a match, the OS can mark (916) the response object list that the particular response object data is to be downloaded to the user agent and the method can proceed to connector 930. On the other hand, if there is a match, the OS can determine (918) whether the request object data that matches the response object data is fresh or stale. If the request object data is fresh, the OS can delete (920) the matching response object data from the response object list because a data cache of a user agent has a fresh copy and the method can proceed to connector 930. Alternatively, in some embodiments, the OS can mark the response object list that the particular server object is not to be downloaded to the user agent. Alternatively, in some embodiments, the OS can mark the response object list that the particular server object is to be downloaded to the user agent.

If the request object data is stale, the OS can request (922) the content server to verify the freshness of the request object data. The OS can then determine (924) whether the content server verified that the request object data was either fresh or stale. If the content server verified that the request object data was stale, the OS can mark (926) the response object list that the particular response object data is to be downloaded to the user agent and the method can proceed to connector 930. Otherwise, if the content server verified that the request object data was fresh, the OS can mark (928) the response object list that the particular response object data is not to be downloaded to the user agent and the method can proceed to connector 930. In some embodiments, this freshness data can be provided to a client device so that it can notify the data cache that the stored information that is marked as being stale is indeed fresh. In some embodiments, the OS can mark the response object list that the particular object data is to be downloaded to the user agent and the method can proceed to connector 930.

Once the method has proceeded to connector 930, the OS can determine (932) whether there is any additional response object data that should be compared with any request object data. If so, the method proceeds to connector 912. Otherwise, the method proceeds to connector 934 and the OS can transmit (936) optimized data to a client device or a user agent. The optimized data can include, among other things, the response data, the embedded response data, and any freshness data. Based on the type of data within the optimized data, the user agent and/or the client device can process the data accordingly, which was described above.

In some embodiments, transmission step 936 is based on the capabilities of the user agent (and/or the client device) and the content server. For example, the OS can determine the hardware/software capabilities of the user agent for supporting multipart data can be determined by the request data explicitly stating multipart support, a user agent string of the request data, source IP address of a device (e.g., user agent 102) making the request, or the OS assumes that multipart is available for every received request data. Further, the OS can determine if the response comes from a server that has capabilities that can support this type of multipart optimization. These capabilities for supporting multipart data can be determined by the response data explicitly stating multipart support (e.g., HTTP response header), IP address of the content server, or the OS assumes that multipart is available for every received response data.

Based on the capabilities of user agent 102 or client 104, the OS has the ability to distinguish which segments of response data are to be sent as optimized data to the user agent. In some embodiments, where these capabilities are present, comparator has the ability to only provide the embedded response data corresponding to the new or stale object data because comparator 224 has determined that the fresh response data is already stored in data cache 202. Thus, only the minimum number of bytes are transmitted to the user agent or the client device. In some embodiments, the optimized data can include the embedded response data that was marked on the response object list as not being downloaded to the user agent (e.g., where the user agent device does not have the capabilities defined above to inform the user agent that a particular response data is fresh).

In some embodiments, where the client device has the capabilities, the OS can include freshness data within the optimized data informing the client device that the request object data that was marked as being stale in the request object list was indeed fresh. This freshness data can be stored at the client device in a freshness cache. When the request monitor receives subsequent requests from user agent 102 and these subsequent requests include stale object data, the request monitor can access the freshness cache to inform the user agent that the object data was indeed fresh so the user agent would not have to download response data corresponding to this "fresh" stale object data.

Furthermore, the optimized data is formed by appending the embedded response data and any other provided data to the response data by using an appending method used in multipart encoding as defined in RFC 1521, 2068, 1867, 2112, 1892, 1847, or any other encoding defined by Internet, MIME, or WAP standards. This appending allows the entire web page to be transferred to the user agent in a single response. In addition to the appending method, the response data may be changed slightly, in accordance with multipart encoding, so the user agent can find the embedded response data. For example, the response object data can be grouped together in the order as they appear in the response to the original request, in the order as the response data comes back from the content server, or based on the MIME type (e.g., GIF images before JPEG images). After transmitting the optimized data, the method can end (938).

The methods disclosed herein may be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand alone program or as a module, component, subroutine, or other unit suitable for use in a computing environment. A computer program can be deployed to be executed on one computer or on multiple computers at one site or distributed across multiple sites and interconnected by a communication network.

In the preceding specification, the invention has been described with reference to specific exemplary embodiments. It will however, be evident that various modifications and changes may be made without departing from the broader spirit and scope of the invention as set forth in the claims that follow. The specification and drawings are accordingly to be regarded as illustrative rather than restrictive sense. Other embodiments of the invention may be apparent to those skilled in the art from consideration of the specification and practice of the invention disclosed herein.

What is claimed is:

1. A method comprising:
   receiving from a client device a request for a web page and a request object list that identifies embedded request object data that has been stored at the client device, wherein the request object list is generated by querying a data cache, provides information for determining whether the embedded request object data is fresh, and is updated to include any existing cookie data corresponding to the embedded request object data as being stale if the embedded request object data is not fresh;
   transmitting the request for the web page to a content server;
   receiving first response data that corresponds to the request;
   identifying embedded response object data within the first response data, wherein the embedded response object data refers to second response data;
   acquiring the second response data from a content server based on the embedded response object data;
   determining whether the embedded response object data does not match any embedded request object data;
   marking second response data that is referenced by the non-matching embedded response object data; and
   providing, at an optimization server, optimized data to the client device having a user agent that requested the web page, wherein the optimized data includes the first response data and the marked second response data, and the marked second response data is provided together with the first response data to the user agent.

2. The method of claim 1, further comprising identifying the request object data within the request.

3. The method of claim 2, further comprising determining whether the embedded response object data matches the request object data.

4. The method of claim 3, further comprising determining whether the request object data is fresh or stale if the embedded response object data matches the request object data.

5. The method of claim 4, further comprising indicating that the optimized data does not include the second response data referenced by the embedded response object data if the matching request object data is fresh.

6. The method of claim 4, further comprising determining whether the content server verified that the matching request object data was fresh or stale if the request object data is stale.

7. The method of claim 6, further comprising indicating that the optimized data includes the second response data referenced by the embedded response object data if the content server verifies that the matching request object data is stale.

8. The method of claim 6, further comprising indicating that the optimized data does not include the second response data referenced by the embedded response object data if the content server verifies that the matching request object data is fresh.

9. The method of claim 8, further comprising updating a freshness cache so that the client device can notify the user agent that a subsequent request object data that is marked as stale is fresh.

10. The method of claim 8, further comprising updating content data from stale to fresh at a data cache of the user agent.

11. The method of claim 1, further comprising determining whether the second response data referenced by the embedded response object data is to be downloaded to the user agent.

12. The method of claim 11, wherein the optimized data includes the second response data if content data referenced by the embedded response object data is to be downloaded to the user agent.

13. The method of claim 11, wherein the optimized data does not include the second response data if content data referenced by the embedded response object data is not to be downloaded to the user agent.

14. A method comprising:
    receiving from a client device a request for a web page and a request object list that identifies embedded request object data that has been stored at the client device, wherein the request object list is generated by querying a data cache, provides information for determining whether the embedded request object data is fresh, and is updated to include any existing cookie data corresponding to the embedded request object data as being stale if the embedded request object data is not fresh;
    receiving first response data corresponding to the web page from a content server;
    identifying embedded response object data within the first response data, wherein the embedded response object data refers to second response data;
    acquiring the second response data from a content server based on the embedded response object data;
    determining whether the embedded response object data does not match any embedded request object data;
    marking second response data that is referenced by the non-matching embedded response object data; and
    transmitting, at an optimization server, optimized data that includes the first response data and the marked second response data, wherein the marked second response data is transmitted together with the first response data.

15. The method of claim 14, further comprising determining whether the request includes a request object list.

16. The method of claim 15, further comprising providing the request object list identifying the request object data within the request if the request includes a request object list.

17. The method of claim 16, further comprising determining whether the embedded response object data matches the request object data.

18. The method of claim 17, further comprising determining whether the request object data is fresh or stale if the embedded response object data matches the request object data.

19. The method of claim 18, further comprising indicating that the optimized data does not include the second response data referenced by the embedded response object data if the request object data is fresh.

20. The method of claim 18, further comprising verifying with the content server that the request object data was fresh or stale if the request object data is stale.

21. The method of claim 20, further comprising indicating that the optimized data includes the second response data referenced by the embedded response object data if the request object data has been verified to be stale.

22. The method of claim 20, further comprising indicating that the optimized data does not include the second response data referenced by the embedded response object data if the request object data has been verified to be fresh.

23. The method of claim 14, further comprising determining whether the second response data referenced by the embedded response object data is to be downloaded to a user agent.

24. The method of claim 23, wherein the optimized data includes the second response data if the second response data referenced by the embedded response object data is to be downloaded to the user agent.

25. The method of claim 23, wherein the optimized data does not include the second response data if content data referenced by the embedded response object data is not to be downloaded to the user agent.

26. A method comprising:
transmitting at a client device a request for a web page to a content server, wherein the request is appended with a request object list that identifies embedded request object data that has been stored at the client device, wherein the request object list is generated by querying a data cache, provides information for determining whether the embedded request object data is fresh, and is updated to include any existing cookie data that is retrieved from a cookie cache and corresponds to the embedded request object data as being stale if the embedded request object data is not fresh; and
receiving optimized data that includes first response data together with marked second response data,
wherein the first response data is provided by the content server in response to the request, and
wherein the marked second response data has been generated using:
an identification of embedded response object data within the first response data, wherein the embedded response object data refers to second response data,
an acquisition of the second response data from a content server based on the embedded response object data,
a determination of whether the embedded response object data does not match any embedded request object data, and
a marking of second response data that is referenced by the non-matching embedded response object data.

27. The method of claim 26, further comprising updating the request object list by marking the embedded request object data as being fresh if the embedded request object data is fresh.

28. The method of claim 26, further comprising updating the request object list by marking the embedded request object data as being stale if the embedded request object data is not fresh.

29. A system comprising:
a client hardware device, having a user agent, configured to receive a request for a web page,
query a data cache to generate a request object list that identifies embedded request object data of the request,
determine whether the embedded request object data is fresh,
query a cookie cache to retrieve any existing cookie data corresponding to the embedded request object data as being stale if the embedded request object data is not fresh,
update the request object list to include the any existing cookie data, and
transmit the request for a web page and the request object list that identifies embedded request object data that has been stored at the client hardware device; and
an optimization server configured to
receive a first response data corresponding to the request from a content server,
identify embedded response object data within the first response data, wherein the embedded response object data refers to the second response data,
acquire the second response data from a content server based on the embedded response object data,
determine whether the embedded response object data does not match any embedded request object data,
mark second response data that are referenced by the non-matching embedded response object data, and
transmit optimized data to the user agent,
wherein the optimized data includes the first response data and the marked second response data, and the marked second response data is transmitted together with the first response data to the user agent.

30. A non-transitory computer-readable medium encoded with computer-implemented instructions, when executed, causing a computer to perform a method, the method comprising:
receiving from a client device a request for a web page and a request object list that identifies embedded request object data that has been stored at the client device, wherein the request object list is generated by querying a data cache, provides information for determining whether the embedded request object data is fresh, and is updated to include any existing cookie data corresponding to the embedded request object data as being stale if the embedded request object data is not fresh;
receiving first response data from a content server, wherein the first response data corresponds to a request for a web page;
identifying embedded response object data within the first response data, wherein the embedded response object data refers to second response;
acquiring the second response data from a content server based on the embedded response object data;
determining whether the embedded response object data does not match any embedded request object data;
marking second response data that is referenced by the non-matching embedded response object data; and
transmitting, at an optimization server, optimized data that includes the first response data and the marked second response data, wherein the marked second response data is transmitted together with the first response data.

31. A non-transitory computer-readable medium encoded with computer-implemented instructions, when executed, causing a computing device to perform a method, the method comprising:
transmitting a request for a web page to a content server, wherein the request is appended with a request object list that identifies embedded request object data that has been stored at a client device, wherein the request object list is generated by querying a data cache, provides information for determining whether the embedded request object data is fresh, and is updated to include any existing cookie data that is retrieved from a cookie cache and corresponds to the embedded request object data as being stale if the embedded request object data is not fresh; and receiving optimized data that includes first response data together with marked second response data, wherein the first response data is provided by the content server in response to the request, and wherein the marked second response data has been generated using:

an identification of embedded response object data within the first response data, wherein the embedded response object data refers to second response data, an acquisition of the second response data from a content server based on the embedded response object data, a determination of whether the embedded response object data does not match any embedded request object data, and a marking of second response data that is referenced by the non-matching embedded response object data.

* * * * *